United States Patent [19]

Mandel et al.

[11] 4,022,296
[45] May 10, 1977

[54] SIGNAL INPUT DEVICES AND SYSTEMS

[75] Inventors: Alan F. Mandel, Pittsburgh, Pa.;
Jerry D. Bass, Martinez, Calif.

[73] Assignee: Westinghouse Electric Corporation, Pittsburgh, Pa.

[22] Filed: May 16, 1975

[21] Appl. No.: 578,301

[52] U.S. Cl. ................... 187/29 R; 340/19 R; 340/380

[51] Int. Cl.² ........................... B66B 3/00

[58] Field of Search ............. 187/29; 340/19-21, 340/332, 343, 380, 381, 383

[56] References Cited

UNITED STATES PATENTS

| 2,525,768 | 10/1950 | Bruns | 187/29 |
|---|---|---|---|
| 2,525,769 | 10/1950 | Bruns | 187/29 |
| 2,738,489 | 3/1956 | Borden | 340/19 |
| 3,686,686 | 8/1972 | Hall | 340/343 X |
| 3,899,786 | 8/1975 | Greubel et al. | 340/380 X |

Primary Examiner—Robert K. Schaefer
Assistant Examiner—W. E. Duncanson, Jr.
Attorney, Agent, or Firm—D. R. Lackey

[57] ABSTRACT

Signal input devices and systems which include a switch, a continuously energized light source, and an electro-optic light value disposed between the back of the switch and the light source. The electro-optic light valve is operable between light transmitting and light blocking conditions, with the electro-optic light valve being switched from one of its conditions to the other in response to actuation of the switch. The switch includes a printed circuit board having an opening therein, with certain of the electrically conductive elements of the switch being disposed on the printed circuit board. The opening in the printed circuit board enables light from the light source to be visible from the front side of the switch, such as through a light transmissive actuating button, when the electro-optic light valve is in its light transmitting condition. A plurality of signal input devices may be grouped, with a common light source. A specific application of a plurality of signal input devices used as a call input station in an elevator system, is also disclosed.

28 Claims, 10 Drawing Figures

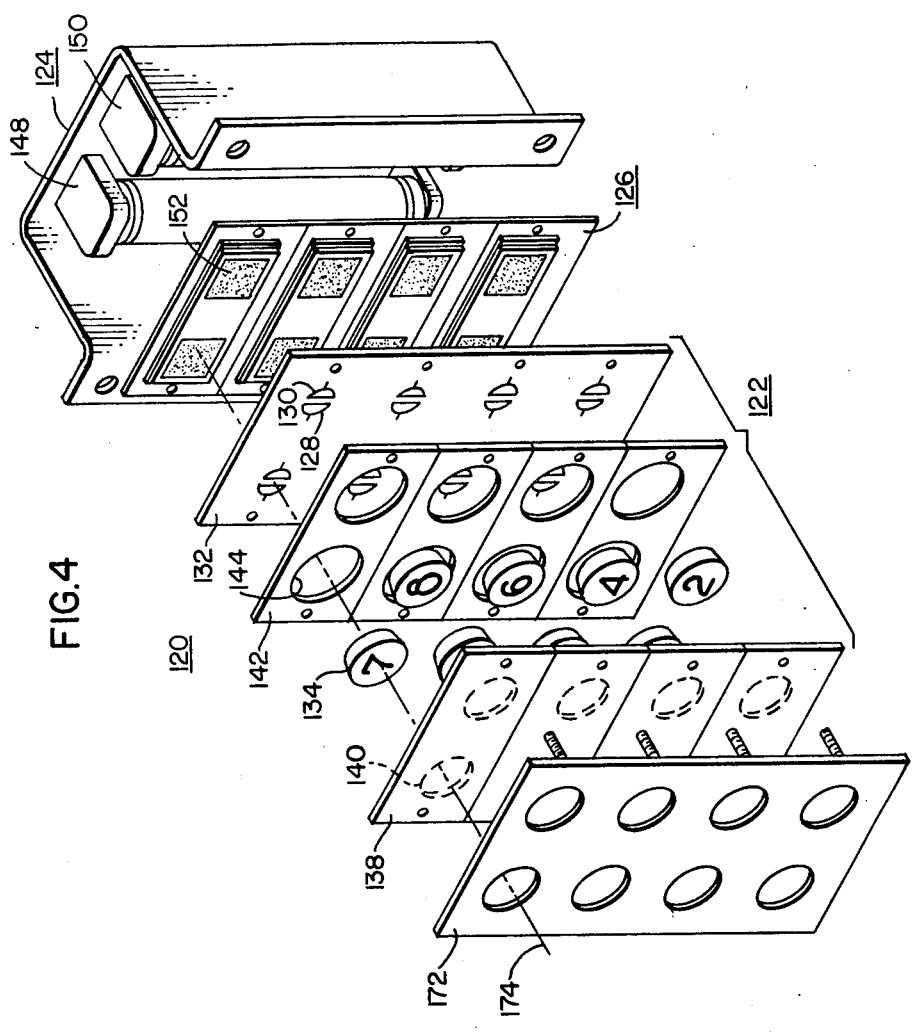
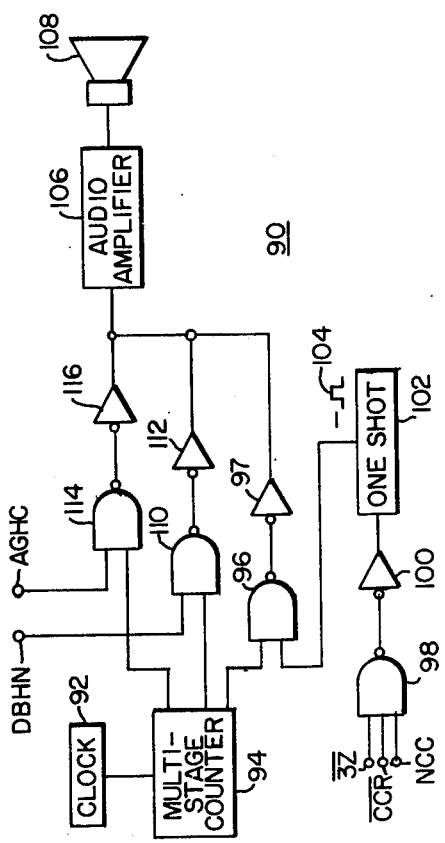
FIG.4
FIG.3

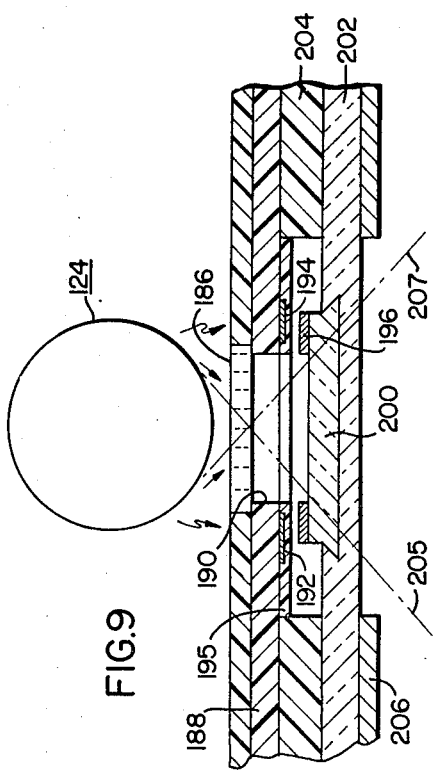
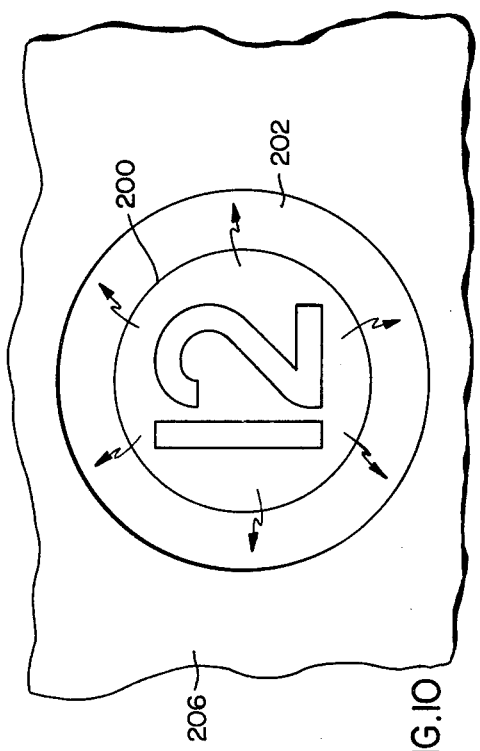
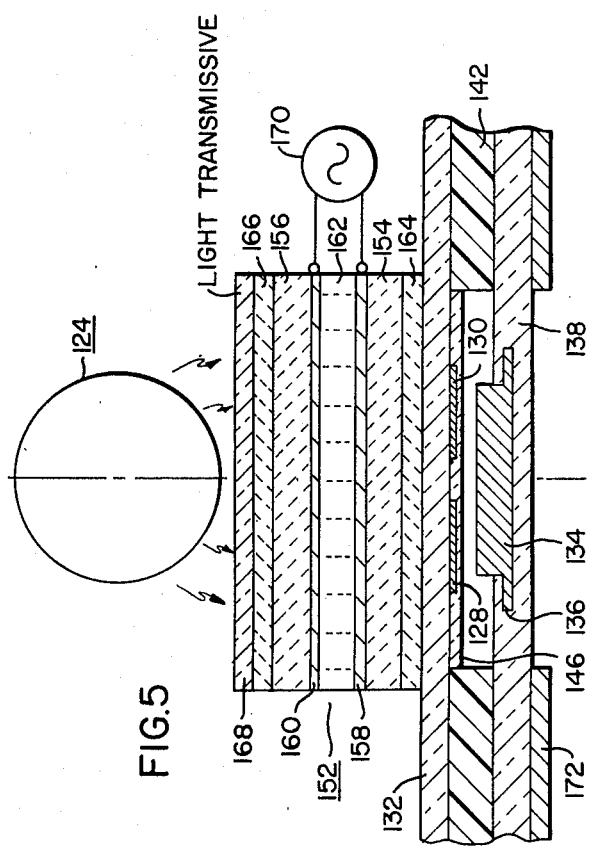
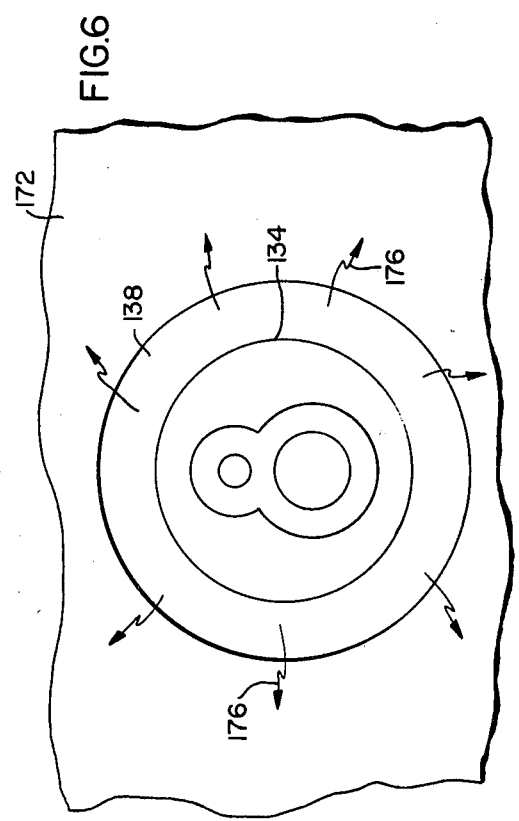

SIGNAL INPUT DEVICES AND SYSTEMS

CROSS-REFERENCE TO RELATED APPLICATIONS

Certain of the apparatus disclosed herein is claimed in the concurrently filed Application Ser. No. 578,302, filed May 16, 1975 in the names of A. F. Mandel and L. C. Vercellotti, which is assigned to the same assignee as the present application.

BACKGROUND OF THE INVENTION

1. Field of the Invention

The invention relates in general to signal input devices and systems, and more specifically to such devices and systems which include a switch, and means operable by the switch to indicate actuation thereof.

2. Description of the Prior Art

In describing signal input devices of the prior art, it will be useful to describe a specific application of signal input devices in an elevator system. It will be apparent how certain problems associated with signal input devices in an elevator environment are also prevalent in other applications of such devices.

More specifically, in elevator systems car calls entered by passengers in the elevator car are generally entered on a car call pushbutton station which includes a pushbutton or switch for each floor the elevator car is enabled to serve. An incandescent lamp is associated with each pushbutton, with a lamp being energized when its associated pushbutton is actuated, to indicate to the passenger that the car call has been entered. A car call associated with an actuated button is sent to the floor selector and its associated control of the elevator car, and at some point during the answering of the car call the call is reset and the energized lamp associated with the car call is extinguished. The pushbuttons in the car call station are generally of the mechanical type in which a movable electrically conductive element makes ohmic contact with two spaced stationary elements, to complete an electrical circuit.

Each car call pushbutton and associated lamp generally has a wire in the traveling cable which interconnects the elevator car with the remotely located portion of the car control. This control includes the floor selector, as well as the control for the specific elevator drive utilized, such as the control for an A.C. or D.C. motor in a traction elevator system, and the control for a hydraulic cylinder, in a hydraulic elevator system.

Voltages of at least 100 volts are usually used in the car call pushbutton circuits, in order to break down any oxidation which may have formed on the electrically conductive elements, as well as to permit the use of low current incandescent lamps for the desired wattage or brightness level. A low current lamp permits relatively small common lamp return wires in the traveling cable, and variations in IR drop in the common lamp wiring in the relatively long traveling cable will have little or no adverse affect on the lamp brightness as additional calls are registered and their associated lamps energized.

The prior art car call control presents certain problems. The high voltage required at the pushbutton contacts is not compatible with solid state logic systems which are now being used to process car call signals, making it necessary to use high voltage to low voltage interface circuits between each pushbutton and the low voltage logic control. Further, the random failure of incandescent lamps, long a problem in the elevator industry, is especially pronounced when high voltage lamps are used because the long and delicate filament of the high voltage lamp is susceptible to early failure due to mechanical vibrations inherent in the operation of an elevator car. The failure of a single lamp may necessitate a special service call to replace the lamp. Further, the manufacture and assembly of the car call pushbutton station is costly, as the pushbuttons are manufactured as individual units which are manually assembled, aligned with openings in the cover plate of the station, and manually wired.

SUMMARY OF THE INVENTION

Briefly, the present invention relates to new and improved signal input devices, combinations of such devices in a unitary signal input panel, and to elevator systems in which a plurality of the signal input devices are used in call input stations, such as car call stations.

The new and improved signal input device includes a switch, a source of visible light which is continuously energized, at least during the time that the signal input device is to be in an operative condition, and an electro-optic light valve, such as a field effect liquid crystal. The electro-optic light valve is a passive device, i.e., it is not a source of light, but it is switchable with appropriate electrical signals between light blocking and light transmitting conditions. The electro-optic light valve is disposed between the back side of the switch and the light source such that when the light valve is in the light transmitting condition it permits light from the light source to strike the back of the switch.

The switch, which has two stationary electrically conductive elements or electrodes and a movable electrically conductive element or electrode, includes a sheet member of opaque electrical insulating material which has an opening therein. The stationary elements of the switch are mounted on the insulating sheet member about the opening. The movable element is washer shaped, i.e., a flat circular member with a centrally disposed opening therein. The movable element is resiliently spaced from the stationary elements, with the openings in the movable element and in the insulating sheet member being substantially coaxial. The movable element is actuatable towards the stationary elements via a pushbutton member formed of light transmissive materials, i.e., transparent or translucent, and detector means detects a change in a predetermined electrical parameter responsive to the change in spacing, such as a resistance or capacitance change, and the detector means provides a signal in response thereto which switches the electro-optic light valve from one of its conditions to the other.

Combinations of such signal input devices utilize a plurality of switches and a plurality of electro-optic light valves with a common, continuously energized light source. The electro-optic light valves may be mounted in a common opaque sheet member, and the stationary elements of the switches may be plated on a common printed circuit board having a plurality of openings therein, with the stationary elements or electrodes of each switch being disposed about one of the openings.

In an elevator system, a plurality of the devices may be mounted in the car call station in an elevator car with the switches preferably being of the capacitive type, and the electro-optic light valves preferably being field effect liquid crystals. The capacitive switches and liquid crystals operate at voltage levels compatible with the logic voltage levels of the associated control, and their low power usage permits a simple, low cost power supply to be used. The actuation of the movable element or electrode of a switch places a car call which is sent to the floor selector via the traveling cable and the associated electro-optic light valve is switched from a light blocking to a light transmitting condition to provide visible feedback to the passenger that his call has been entered. At a predetermined point during the process of answering a car call, the floor selector provides signals which result in a reset signal being sent to the elevator car via the traveling cable which switches the electro-optic light valve back to the light blocking condition.

BRIEF DESCRIPTION OF THE DRAWINGS

The invention may be better understood, and further advantages and uses thereof more readily apparent, when considered in view of the following detailed description of exemplary embodiments, taken with the accompanying drawings in which:

FIG. 3 is a schematic diagram of a new and improved audible feedback arrangement for car call registration, combined with certain other functions which generate audible signals in the elevator car;

FIG. 4 is an exploded, perspective view of a plurality of signal input devices which may be used for the car call entry and display station shown in FIGS. 1 and 2, or for any other signal input panel or electronic keyboard;

FIG. 5 is a plan view, in section, of one of the signal input devices shown in FIG. 4;

FIG. 6 is an elevational view of the signal input device shown in FIG. 5;

FIG. 9 is a plan view, in section, of one of the signal input devices shown in FIG. 8; and FIG. 10 is an elevational view of the signal input device shown in FIG. 9.

DESCRIPTION OF PREFERRED EMBODIMENTS

Figure 1:
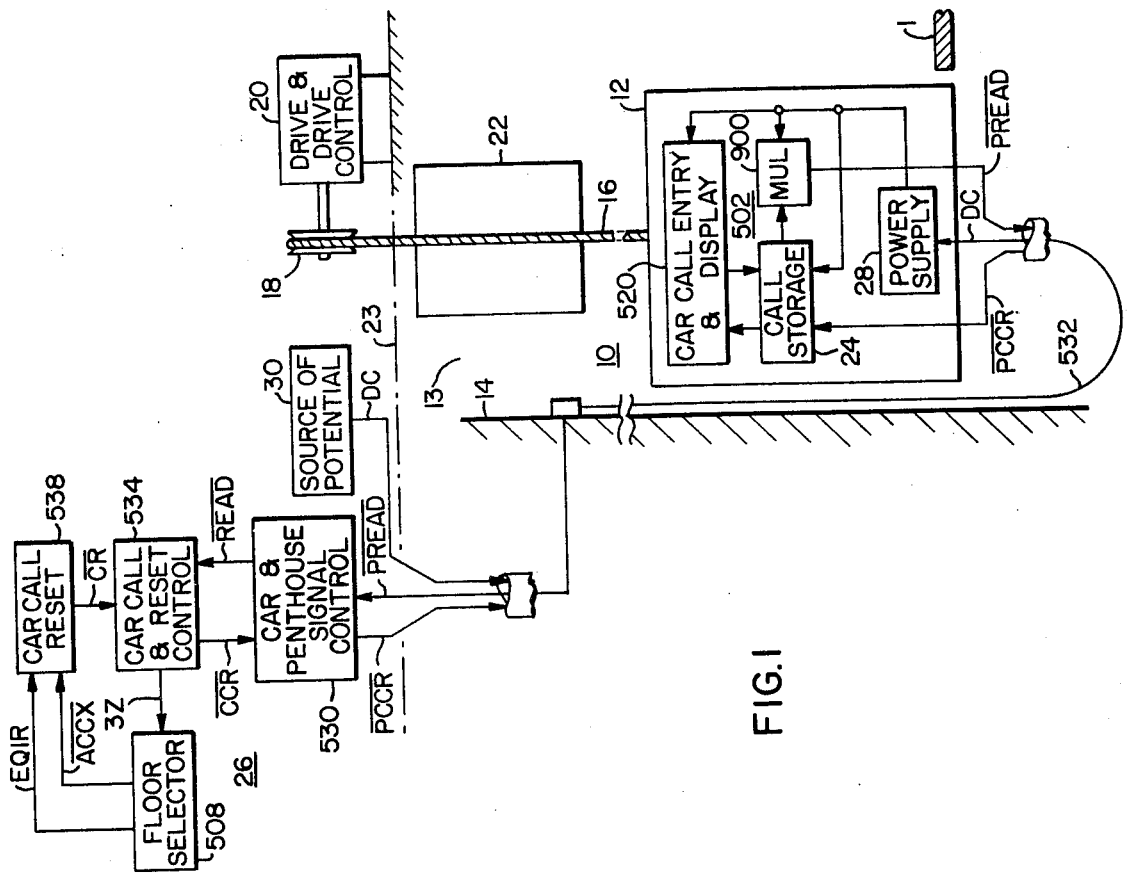
FIG. 1 is a diagrammatic representation of an elevator system which may utilize the teachings of the invention.

Referring now to the drawings, and FIG. 1 in particular, there is shown an elevator system 10 of the type which may utilize the teachings of the invention. While the elevator system 10 illustrated in FIG. 1 is of the traction type, it is to be understood that the invention is equally applicable to elevator systems with any type of motive means, such as hydraulic elevators.

Only that part of a complete elevator system necessary to understand the invention is shown in FIG. 1. For purposes of example, it will be assumed that the elevator system 10 utilizes the floor selector and other car control disclosed in U.S. Pat. No. 3,750,850. U.S. Pat. No. 3,807,531 discloses modifications to the floor selector shown in U.S. Pat. No. 3,750,850 for group supervisory control by a system processor, as well as new and improved apparatus for serializing and multiplexing car calls from the car station over the traveling cable to the remotely located floor selector. The elevator system disclosed in these patents continuously generates scan or time slots in a binary scan counter, with the floors of the associated building each being assigned to a different scan slot. Floor related information is serialized and it appears in the scan slot assigned to that floor. These U.S. patents, which are assigned to the same assignee as the present application, are hereby incorporated into the present application by reference. Where applicable, the signals and reference numerals used in these incorporated patents will be used in the present application when describing similar signals and functions.

Elevator system 10 includes an elevator car 12 mounted in a hatchway 13 for movement relative to a structure or building 14 having plurality of floors or landings, illustrated generally at 15. The elevator car 12 is supported by a plurality of wire ropes, shown generally at 16, which are reeved over a traction sheave 18 mounted on the shaft of a drive motor 20, such as a direct current motor as used in the Ward-Leonard drive system, or in a solid state drive system. A counterweight 22 is connected to the other end of the ropes 16. The drive motor 20 and its associated control are generally mounted in a penthouse, shown in general as being above the broken line 23. A car station 502 is mounted in the elevator car 12, and it includes a car call entry and display panel 520, means 24 for storing the car calls until they are reset by the response of the elevator car in servicing the call, and a multiplexer circuit 900 for multiplexing the car calls and other car station signals to provide a serial signal $\overline{\text{PREAD}}$ for transmission to the remotely located portion 26 of the car control over a traveling cable 532. The car station 502 also includes a power supply 28 which receives a unidirectional potential, referenced D.C., from a penthouse source 30 via the traveling cable 532.

The car control 26 located remotely from the elevator car 12, may also be located in the penthouse with the drive and drive control 20. This portion of the car control includes a floor selector 508, car and penthouse signal control 530, car call and reset control 534, and car call reset control 538. The car and penthouse signal control 530 receives the signal $\overline{\text{PREAD}}$, separates the serialized car calls from the other car related signals, and sends the serialized car calls to the car call and reset control 534 as the signal $\overline{\text{READ}}$. The car call and reset control 534 sends serial car calls to the floor selector 508 as signal 3Z.

Car call reset control 538 receives a serial advanced car position signal EQIR and an acceleration request signal ACCX from the floor selector 508. When signal ACCX goes high (to a logic one) it indicates a deceleration request has been made for the elevator car to stop at the floor of the advanced car position signal EQIR and a car call reset signal $\overline{\text{CR}}$ is generated in the scan or time slot associated with the floor of the advanced car position. Serialized reset signals $\overline{\text{CR}}$ are sent to the car call and reset control 534 from the car call reset 538, the car call and reset control 534 sends serialized car call resets $\overline{\text{CCR}}$ to the car and penthouse signal control 530. The car and penthouse signal control 530 processes the car call resets and sends them to the call storage 24 in the car station 502, over the traveling cable 532, as serial signal $\overline{\text{PCCR}}$. The serialized reset signal resets the appropriate memory element in the call storage 24, and removes the car call registered indication on the car call entry and display panel 520.

Figure 2:
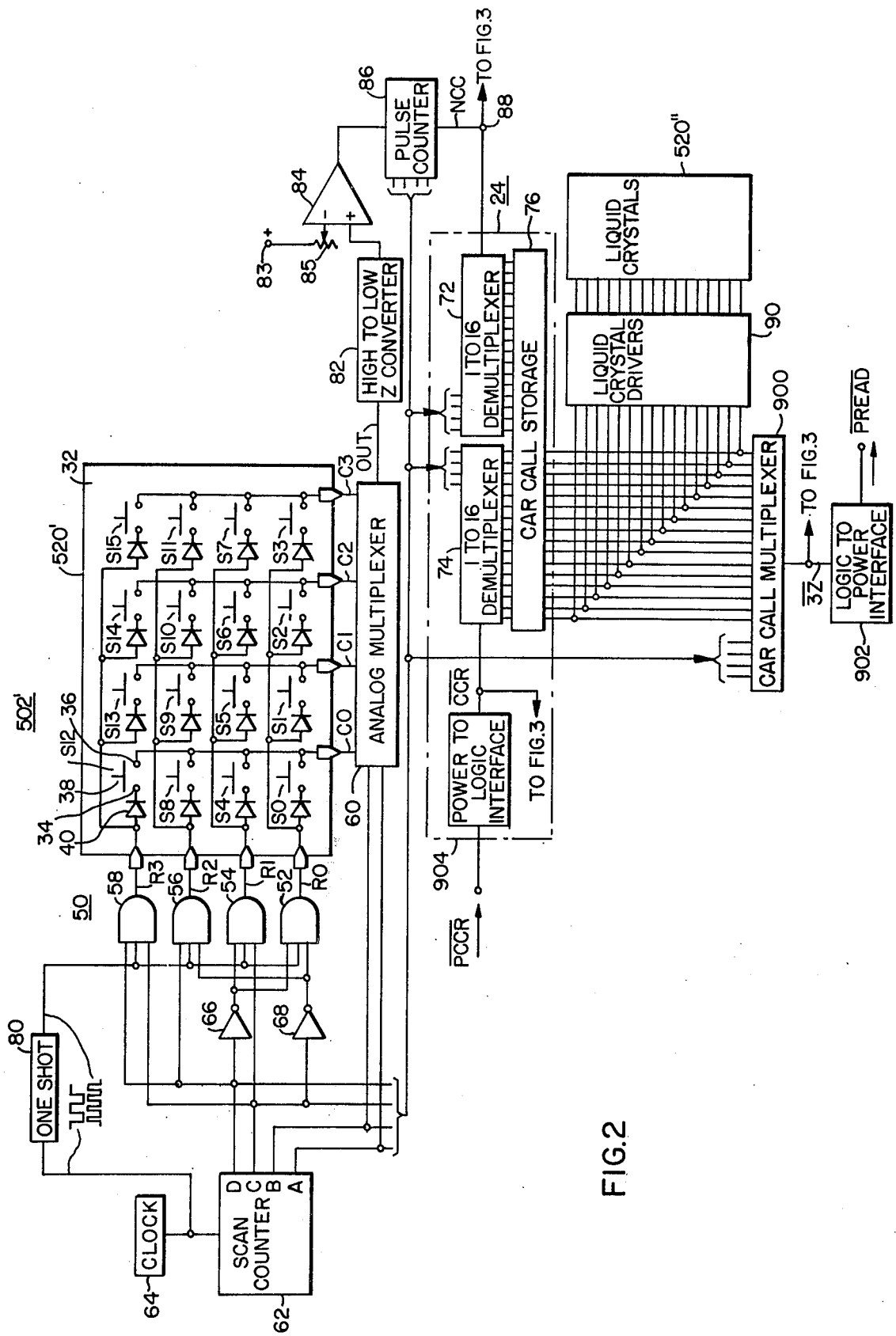
FIG. 2 is a schematic diagram of a car call entry and display station which may be constructed according to the teachings of the invention.

FIG. 2 is a schematic diagram of a car call entry and display station 502', which may be used for the car call entry and display station shown in FIG. 1. The car call entry and display panel 520 of station 502' is shown divided into its two functions, with the call entry function being illustrated at 520', and the display function at 520''.

The call entry function 520' includes a plurality of switches, such as 16, referenced S0 through S15, which may be connected in an X-Y matrix, as illustrated. Each of the switches have first and second opposed sides, with the first side being the front or actuating side, and the second side being the back of the switch. While the switches S0-S15 may be 16 individual pushbuttons, it is preferable that the switches S0-15 be batch fabricated by plating, etching, or otherwise applying an electrically conductive coating to the surface of the printed circuit board 32, to form first and second stationary electrically conductive elements, electrodes or contacts of the switches, such as stationary electrodes 34 and 36, respectively, of switch S12. The means for actuating the switches S0-S15 when used in an elevator application is preferably a movable electrode or element, such as movable electrode 38 of switch S12, which when actuated to reduce the spacing between the movable and stationary electrodes changes a predetermined electrical parameter. For example, it may form a metallic connection between the first and second stationary electrodes when depressed, changing the electrical resistance between the stationary electrodes, or it may simply move close to the stationary electrodes without actual metallic contact therewith, to change the electrical capacitance between the electrodes of the switch.

The stationary electrodes of the switches S0-S15 are electrically interconnected in an X-Y matrix by electrically connecting the first stationary electrodes of the switches S0, S1, S2 and S3 to terminal R0, by connecting the first stationary electrodes of switches S4, S5, S6 and S7 to terminal R1, by connecting the first stationary electrodes of switches S8, S9, S10 and S11 to terminal R2, and by connecting the first stationary electrodes of switches S12, S13, S14 and S15 to terminal R3. The matrix construction further requires the connecting of the second stationary electrodes of switches S0, S4, S8 and S12 to terminal C0, the connection of the second stationary electrodes of switches S1, S5, S9 and S13 to terminal C1, the connection of the second stationary electrodes or switches S2, S6, S10 and S14 to terminal C2, and the connection of the second stationary electrodes of switches S3, S7, S11 and S15 to terminal C3. The terminals R0 through R3 also identify the X or row conductors of the matrix, while the terminals C0 through C3 also identify the Y or column conductors of the matrix.

The switches S0-S15 may be interconnected by wires inserted through holes disposed in the printed circuit board 32, which are soldered to the stationary contacts, or preferably by conductive portions plated or etched on the surface of the printed circuit board 32 which are integrally connected to the associated stationary contacts and brought to the edge of the printed circuit board.

If the switches S0-S15 are actuated by bridging the stationary electrodes or contacts with a direct metallic connection, there will be very little attenuation of a unidirectional signal applied to the X or row conductors as it proceeds through a plurality of simultaneously closed switches. To prevent false indication of a call through a plurality of simultaneously closed switches through "sneak" circuits, a rectifier or diode should be connected from each row conductor R0 through R3 to the first electrical contacts of the switches, such as rectifier 40 connected from row conductor R3 to the first contact 34 of switch S12, with the rectifier being poled as indicated in the figure. If the switches S0-S15 are of the movable electrode capacitive type, the amount of signal attenuation through the capacitance of each switch will prevent false indication of a call through a plurality of simultaneously actuated switches, and thus the rectifiers are not required.

Detector means for detecting the actuation of a switch may include conventional apparatus for scanning a matrix, such as disclosed on pages 24 and 25 of the May 1969 issue of magazine EEE. For example, the rows R0 through R3 may be selectively enabled by a row driver circuit 50 which may include dual input AND gates 52, 54, 56 and 58 which have their outputs connected to input terminals R0, R1, R2 and R3 respectively. The AND functions may be performed by RCA's COS/MOS Quad 2-input NAND gate CD 4011A with inverters CD 4049A, for example. The columns C0 through C3 are selectively enabled by a column driver circuit 60, such as RCA's COS/MOS Analog Multiplexer CD 4052A. The matrix of switches S0-S15 are scanned by providing a 4-stage binary counter 62, such as by using 4 stages of RCA's COS/MOS 7-stage binary counter CD 4024A, driven by a clock 64 which provides input pulses for advancing the count value. The clock 64 may be a 4 KHz. oscillator formed of COS/MOS NAND inverter or NOR gates, such as RCA's COS/MOS NOR gate CD 4001, connected as shown on page 531 of RCA's Solid State Data Book Series, Book SSD-203C, 1975 edition. The most siginficant bit D of the scan counter 62 is connected directly to an input on each of the AND gates 56 and 58, and to an input on each of the AND gates 52 and 54 via an inverter 66. The next most significant bit C is connected directly to an input on each of the AND gates 54 and 58, and to an input on each of the AND gates 52 and 56 via an inverter 68. The two least significant bits A and B are connected to inputs on the analog multiplexer 60. This arrangement successively energizes rows R0 through R3, and while each row is energized, the analog multiplexer successively connects each column conductor C0 through C3 to the output OUT.

The binary address of switch S0 is 0000, and when the output of counter 62 is 0000 the condition of switch S0 will be monitored. If the switch S0 is actuated, the output OUT will be high during the count value 0000, and if it is not actuated, the output OUT will be low during this scan or time slot. Scan slot 0000 is assigned to the lowest floor of the building, and thus when switch S0 is actuated a car call for the lowest floor of the building would be registered. In like manner, the address of switch S1 is 0001, the address of switch S2 is 0010, etc., with the switches being associated with successively higher floors of the building. With 16 floors in the building and with horizontally increasing notations applied to the switches on the call entry panel, the prior art clock and counter arrangement described will perform the scanning of the matrixed switches correctly. If there are fewer floors than switches in the matrix, and/or the notations increase vertically instead of horizontally, rewiring of the matrix may be precluded by connecting a programmable read-only memory between the output of the scan counter 62 and the rest of the electrical circuit, as disclosed in the concurrently filed Application Ser. No. 578,303, filed May 16, 1975, in the name of A. F. Mandel, which is assigned to the same assignee as the present application.

The output OUT of the analog multiplexer 60 provides indications of car calls in serial form, which calls must be stored until reset, and the stored calls must be provided in serial form for transmission to the remotely located floor selector. If the switches S0-S15 are of the ohmic contact type, the signal OUT may be applied directly to the car call storage function 24. If the switches S0-S15 are of the movable electrode, capacitive type, such as disclosed in U.S. Pat. Nos. 3,293,640; 3,419,697; or 3,660,838, for example, a bipolar or unipolar signal which has a magnitude which changes at a rate sufficient to be coupled through the capacitance of an actuated switch may be provided. Unipolar pulses at an acceptable rate may be conveniently provided by connecting an edge catcher circuit or "one shot" 80 to the output of clock 64. If clock 64 is a 4 KHz clock, for example, the one shot 80 may be arranged to provide a pulse of short duration, such as 5 microseconds, on each transition of the clock, with each pulse being separated from the next by 125 microseconds. The output of one shot 80 is connected to an input of each of the AND gates 52, 54, 56 and 58.

When a switch is actuated, the pulses provided by the one shot 80 will be coupled through the switch and appear in the signal OUT. With the arrangement described above, sixteen unipolar pulses will be applied to each row in succession, and thus each column will be enabled for 4 pulses. The output OUT is connected to a high-to-low impedance converter 82, such as an FET follower, and the output of converter 82 is connected to a comparator amplifier 84, such as to the non-inverting input of an operational amplifier, which ensures that the pulse magnitude exceeds a predetermined selected threshold before the pulses are allowed to pass through the comparator amplifier. The threshold may be set by connecting a source of unidirectional potential, represented by terminal 83, to the inverting input of the operational amplifier via an adjustable resistor 85. A pulse counter 86 is connected to the output of comparator 84, which ensures that the signal is indeed from an actuated switch, and not merely a transient. The pulse counter 86 may be two D-type edge triggered flip-flops connected in a counter arrangement to provide an output at terminal 88 if the pulse counter receives and counts three pulses, for example. The signal at terminal 88, referred to as signal NCC, will be high during a scan slot for which a new car call has been registered. The pulse counter 86 is reset each time the scan counter 62 provides a new switch address, by connecting the output of the scan counter to the reset circuitry of the pulse counter 86.

The call storage function 24 may include a 1 to 16 demultiplexer 72, such as RCA's CD4515B, for demultiplexing the serial car call signal OUT if the switches are resistive, or NCC if the switches are capacitive, a 1 to 16 demultiplexer 74 for demultiplexing the serial car call reset, a power voltage to logic voltage interface 904 for reducing the voltage level of the serial car call reset signal $\overline{PCCR}$ to provide the serial car call reset signal $\overline{CCR}$, and car call memory elements 76, such as 16 J-K flip-flops, which are responsive to the outputs of the demultiplexers 72 and 74.

Each of the demultiplexers 72 and 74 receive the output of the scan counter 62, which is decoded to enable the proper gate in the demultiplexer to steer the car calls, and car call resets to the correct memory element in the car call storage 76.

The 16 outputs of the car call storage 76 are connected to a 16 to 1 multiplexer 900, such as RCA's CD4067B, which also receives the output of the scan counter 62. The output of the scan counter 62 is decoded in multiplexer 900 to successively enable the 16 inputs to the multiplexer in the proper order. The serial output $\overline{READ}$ of multiplexer 900 is applied to a logic voltage to high voltage interface 902 to provide a high voltage signal $\overline{PREAD}$ for transmitting the serial car calls over the electrically noisy traveling cable 532.

The 16 outputs of the car call storage 76 are also connected to the display function 520" of the call entry and display station 520, to drive the appropriate indicator and display the registration of the call to the passengers in the elevator car.

As will be hereinafter described, the display includes a plurality of solid state electro-optic light valves which are preferably of the field effect liquid crystal type, and a continuously energized light source common to all of the light valves. In this event, liquid crystal drivers 90, such as RCA's CD4054, would be connected between the output of the car call storage 76 and the display 520".

In a concurrently filed Application Ser. No. 578,304, filed May 16, 1975, in the names of A. Mandel and L. Vercellotti, which application is assigned to the same assignee as the present application a new and improved universal solid state car position indicator with a solid state display, preferably field effect liquid crystals, is disclosed. Field effect liquid crystals are preferred for use in the car position display, and also in the car call display, both of which are mounted in the elevator car, because field effect liquid crystals require very little power, they have a high contrast, a wide viewing angle, they have a relatively low cost, and they are directly compatible with COS/MOS logic, i.e., the same voltage and power density requirements. Field effect liquid crystal displays and associated COS/MOS logic only require a current of about 2 milliamperes, which permits a simple, low cost Zener diode/resistor power supply to be connected to the +125 volt D.C. voltage which is available in the elevator car for driving safety relays.

Certain of the signals developed in the circuit shown in FIG. 2 may be coupled to an audio annunciator to provide a pleasing electronic tone when a new car call is entered on the car call station 520'. This audio tone or "beep" provides additional feedback to the passenger that a car call has been entered. Additional audio signals commonly associated with the operation of an elevator car may also be incorporated into the same audio circuitry. FIG. 3 is a schematic diagram of an audio annunciator 90 which may be used.

More specifically, audio annunciator 90 includes a source of different electrical frequencies in the audio range, which source may include a clock 92 connected to drive a multi-stage binary counter 94. The clock frequency is selected to provide a plurality of electrical signals which switch between two different magnitudes at a rate or frequency in the audio range. A single audio tone of desired duration may be generated when a new car call is entered by connecting one of the outputs of the counter 94 to an input of a dual input NAND gate 96. The other input to NAND gate 96 is developed by connecting serial signals $\overline{3Z}$, $\overline{CCR}$ and NCC to the inputs of a 3 input NAND gate 98. If the switches of the matrix are resistive or ohmic, instead of capacitive, the serial signal OUT would be used instead of the serial signal NCC. When signal NCC goes high in a scan slot, indicating the registration of a new car call for the floor associated with this scan slot, the output of NAND gate 98 will go low if it is indeed a new car call and the car is not already in the presence of stopping at the floor of the call, as the car call signal $\overline{3Z}$ at the output of multiplexer 900 will be high for this scan slot, and the car call reset signal $\overline{CCR}$ will also be high for this scan slot. The electronic tone will be generated only on the initial registration of a car call, because the signal $\overline{3Z}$ will subsequently be low for this scan slot, preventing the output of NAND gate 98 from going low if the same pushbutton is again actuated. Further, the tone will not be generated if the pushbutton is actuated when the car is in the process of stopping at the floor of the call, as signal $\overline{CCR}$ will be low during the scan slot associated with this floor. A low output from NAND gate 98 is inverted by an inverter 100 and the resulting logic one signal is applied to a one shot 102 which provides a single pulse 104 of predetermined duration to an input of NAND gate 96. Thus, NAND gate 96 is enabled for the duration of pulse 104, and the output of NAND gate 96 is switched at the frequency of the selected stage of counter 94. The output of NAND gate 96 is applied to an audio amplifier 106 via an inverting buffer 108 and the electrical signal is converted to an audio tone in a speaker 108.

The same counter 94, audio amplifier 106 and speaker 108 may be used to generate additional audio signals of different tones, such as an audio signal generated in the elevator car when the door is manually held open beyond a predetermined time interval, and an audio signal generated in the car responsive to the registration of a hall call when the car is on attendant service. A signal DBHN which goes true or high when the door has been held open beyond a predetermined period of time, which signal may be generated by a timer, is applied to one input of a dual input NAND gate 110, and the other input is connected to an output of the counter 94. A true signal DBHN enables NAND gate 110 to apply an output of the counter 94 to the audio amplifier via an inverting buffer 112. A more objectionable buzz may be generated by gating two different output stages of the counter to the audio amplifier in response to a true signal DBHN.

In like manner, a signal AGHC, which goes high or true for a short period of time each time a new hall call is assigned to the car when it is on attendant service, is connected to one input of a dual input NAND gate 114, and the other input is connected to an output of the counter 94. A true signal AGHC gates the counter output signal to the audio amplifier 106 via an inverting buffer 116.

FIG. 4 is a perspective view of a new and improved signal entry station 120 which may be used as an electronic keyboard, or any other multiple signal entry station, and is especially suitable for use as the elevator car call entry and display station 520 shown in FIGS. 1 and 2. Signal entry station 120 includes a plurality of switches 122, a light source 124 adapted for continuous energization, at least when the signal entry station is operative to receive input signals, and a plurality of electro-optic light valves 126. FIGS. 5 and 6 are plan and elevational views, respectively, of one of the switches and associated electro-optic light valves shown in FIG. 4, such as the switch and electro-optic light valve combination disposed in the upper-right-hand corner of the panel. The plan view of FIG. 5 illustrates the switch and the electro-optic light valve in cross-section. FIGS. 4, 5 and 6 will all be referred to when describing the construction of the signal entry station 120.

The plurality of switches 122 may include any desired number of switches, with eight being illustrated in FIG. 4 for purposes of example. The switches each include first and second spaced stationary electrically conductive elements, electrodes or contacts, such as electrodes 128 and 130, all of which are plated, etched, or otherwise disposed on the same surface of a sheet of electrical insulating material, such as printed circuit board 132. The electrodes 128 and 130 are formed of copper, or other suitable electrically conductive material. If desired, the electrode may be formed of light transmissive electrically conductive material, such as tin oxide or indium oxide. The printed circuit board 132 is formed of light transmissive material, i.e., transparent or translucent, with a polycarbonate such as Lexan or Rexolite, being suitable. The thickness of the electrical insulating sheet material 132 is not critical, and may be in the range of about 0.0625 inch to 0.125 inch (1.58–3.17 mm.). The first and second stationary electrodes of the switches are preferably connected in an X-Y matrix by conductors which are also applied to the surface of printed circuit board 132 when the stationary electrodes are applied thereto. It will be assumed that the switches 122 are of the movable electrode capacitive type, and thus the diodes shown in FIG. 2 are not necessary.

The movable electrodes each include a flat, circular surface which may be provided by one end of a cylindrical metallic member, or it may be plated on the end of a cylindrical insulating member. In the embodiment shown in FIG. 4 the movable electrode is provided by cylindrical metallic members, such as metallic member 134. The cylindrical metallic members are each resiliently spaced from its associated stationary electrodes, such as by a conventional metallic spring arrangement, or by fastening one end of the cylindrical metallic members to a resilient or flexible plastic sheet member. The latter arrangement is illustrated in the drawings. As illustrated most clearly in FIG. 5, each cylindrical metallic manner, such as member 134, has a flange 136 adjacent one of its ends which enables it to be held captive by a plastic sheet member 138 which has a blind opening 140 which extends inwardly from one of its major opposed surfaces. The blind opening is sized to capture the flange when the sheet member 138 is suitably flexed to enlarge the opening. All of the movable electrodes may be fastened to a single sheet of plastic material, or, as illustrated in FIG. 4 a plurality of sheet members, such as four, may be used, with each sheet member capturing two movable electrodes. Each of the movable electrodes includes a notation which indicates the floor of the building that the button is associated with. The flexible sheet members, such as the sheet member 138, are formed of light transmissive material, either translucent or transparent, such as the polyurethane sheet material available from Products Research and Chemical Corporation, Glendale, California, identified with their designation PR-1538 Amber. The sheet material may be 0.100 inch (2.54 mm.) thick, with the blind opening extending about one-half of the way through the thickness of the sheet. The movable electrode may have a diameter of about 0.75 inch (19 mm.) across the end which is opposite to the flanged end, and the flanged end may have a diameter of about 0.9 inch (22.8 mm.). The thickness of the movable electrode may be about 0.075 inch (1.9 mm.), with 0.025 inch (0.635 mm.) extending outwardly from the surface of the sheet member 138.

Each movable electrode is disposed in spaced relation from its associated stationary electrodes by a spacer member 142 which has an opening therein for each switch. Spacer member 142 may be a single sheet, or, as illustrated in FIG. 4, it may include a plurality of sheet members, each accommodating two switches. The openings in spacer member 142, such as opening 144, are sized to allow the resilient member 138 to be manually depressed such that the movable electrode advances a predetermined dimension toward its associated stationary electrodes, and when the pressure is released, the resilient member returns the movable electrode to its former position. A sheet member 0.0625 inch (1.58 mm.) thick with openings 1.875 inches (46.6 mm.) in diameter has been found to be suitable. The spacer member 142 may be formed of any suitable material, and may be opaque, or light transmissive, as desired.

As illustrated in FIG. 5, a thin coating 146 of electrical insulating material is applied to the stationary electrodes, or it could also be applied to the movable electrode, as desired. The spacing between the movable electrode 134 and the stationary electrodes 128 and 130, when the plastic sheet member 138 is unstressed, is about 0.035 inch (0.89 mm.), and the movable electrode should be arranged such that it may be depressed to contact the insulating coating 146. The insulating coating 146 is preferably chosen to have a relatively high dielectric constant, to provide a large increase in capacitance between each stationary electrode and the movable electrode when the movable electrode is advanced against the coating 146. A large increase in capacitance from the unactuated to the actuated positions of the movable electrode will provide a large increase in the amplitude of the high frequency signal which is coupled through the switch when it is actuated.

The light source 124 is an electric lamp, preferably a mercury vapor lamp such as a fluorescent lamp, but any source of visible light may be used, conventional or solid state. FIG. 4 illustrates two fluorescent lamps 148 and 150. The second lamp is a back-up, as only one continuously energized lamp is necessary in order to practice the invention.

The plurality of electro-optic light valves 126 includes a light valve for each switch, such as light valve 152. The thickness dimension of the electro-optic light valve 152 is shown greatly enlarged in FIG. 5 in order to more clearly illustrate its component parts. The electro-optic light valve is a passive device, i.e., it is not a light source. It is a light shutter or valve, operable between light blocking and light transmitting conditions by application and removal of an electrical signal. While any suitable electro-optic light valve may be used, such as a dynamic scattering liquid crystal, or a field effect liquid crystal, the latter is preferred in an elevator application because of its miniscule use of electrical power. The conventional field effect liquid crystal includes transparent front and back support plates 154 and 156, respectively, which may be formed of a material such as glass, with the support plates being spaced about 0.0002 to 0.0005 inch (0.005–0.013 mm.) by a suitable insulating spacer member, which is utually formed of polytetraflurothylene (not shown). Transparent electrically conductive electrodes 158 and 160 are disposed on the inner surfaces of the front and back support plates 154 and 156, respectively. The space between the plates 154 and 156 is filled with the liquid crystal material, referenced 162. Polarizers 164 and 166 are placed adjacent the front and back support plates, and a light transmissive screen 168 is disposed between polarizer 166 and the light source 124. U.S. Pat. No. 3,792,915 describes in detail the construction of a field effect liquid crystal which may be used.

If the polarizers are similarly aligned, the liquid crystal combination will block light until energized, which "untwists" the liquid crystal material and the combination will then transmit light. If one polarizer is mounted with its orientation 90° from the other, the liquid crystal combination will transmit light until energized, and it will then block light while it is energized. In an elevator call station, the field effect liquid crystal 152 is preferably constructed to be opaque in the absence of an electrical field applied to its electrically conductive electrodes. When a suitable electric field is applied thereto from a source indicated at 170, the molecular orientation of the liquid crystal material 162 changes and the device thus changes from a light blocking state to a transparent state. The energizing source 170 is preferably an alternating current source, such as 60 Hz. to 3 KHz, as alternating drive voltages enable an operating life in excess of 50,000 hours to be achieved. The source 170 represents the liquid crystal driver 90 shown in FIG. 2.

The plurality of liquid crystals 126 are disposed between the plurality of switches 122 and the light source 124, and a cover 172 is disposed over the sheet member 138. Cover 172 has a plurality of openings therein, such as opening 174, which openings have about the same diameter as the openings in the spacer member 142. When the various components are sandwiched together, as illustrated in FIG. 5, the center lines of the various openings are coaxial, as indicated by axis 174. This axis is also the center line of the movable electrode, it intersects the space between the stationary electrodes, and it strikes the midpoint of the electro-optic light valve.

As hereinbefore stated, in an elevator car call application, all of the field effect liquid crystals 126 would be normally deenergized and the light provided by the continuously energized light source 124 would not be visible on the front or actuating sides of the switches 122. When a pushbutton is depressed to couple a high frequency signal through the relatively high capacitance of the actuated switch, a voltage is applied to the associated liquid crystal and it switches from an opaque to a light transmissive condition. Since the printed circuit board 132 and the sheet member 138 are formed of light transmissive materials, the light which is transmitted through the liquid crystal is visible as a ring of light surrounding the movable electrode, with this light being indicated by arrows 176 in FIG. 6. The ring of light remains about the button associated with the car call until the car call is reset by a reset signal in the time slot associated with the floor of the call, i.e., a low or true signal in the serial signal $\overline{CCR}$, at which time the liquid crystal is deenergized and it reverts to its opaque condition, and the light is no longer visible about the movable electrode of the switch.

In other applications of the signal input devices, the movable electrode may be illuminated until actuated, and thus the liquid crystal would have one polarizer mounted 90° relative to the other; or, alternatively, it could have a voltage applied thereto until its associated switch is actuated.

The signal entry station 120 has many advantages, which are specially important in an elevator application. Individual high voltage incandescent lamps are not turned on or off, and thus lamp replacement problems are eliminated or at least substantially reduced. The continuously energized lamps 148 and 150 have a very long operating life, and they may be replaced on a routine inspection schedule. The electro-optic light valves and associated logic, such as COS/MOS logic, are compatible both in voltage and power requirements, enabling a low cost Zener diode power supply to operate from the +125 volts available in the elevator car. Also, although the switches operate by a change in capacitance, they are not touch-type switches which operate on capacitance to earth ground. Thus, ionized air from a fire will not falsely register a call. Further, passengers may easily register a call even when wearing gloves, and calls will not be registered by accidental contact with a button.

Figure 7:
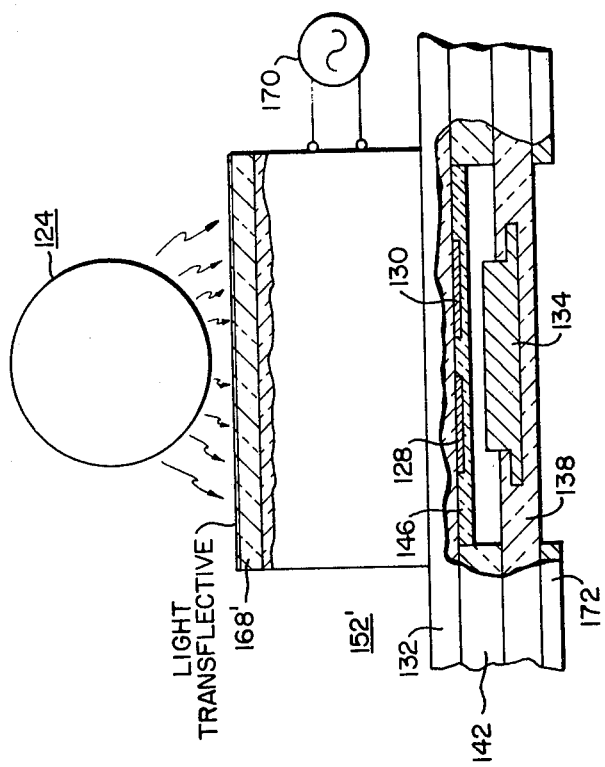
FIG. 7 is a plan view, partially in section, of one of the signal input devices shown in FIG. 4, constructed according to another embodiment.

FIG. 7 is a cross-sectional plan view of a signal input device which is similar to that shown in FIG. 5, except layer 168 of the electro-optic light valve is modified. In FIG. 5, layer 168 is light transmissive. In FIG. 7, this layer, which is referenced 168', is partially light transmissive and partially light reflective, i.e., transflective. The transflective material is available from LXD Corporation, Cleveland, Ohio. In the unlikely event of failure of source 124 to provide light, ambient light will be reflected from layer 168' when an electric field is applied to the liquid crystal, to provide an obvious change in the level of illumination visible about the metallic movable electrode 134 between the energized and the deenergized conditions of the field effect liquid crystal.

Figure 8:
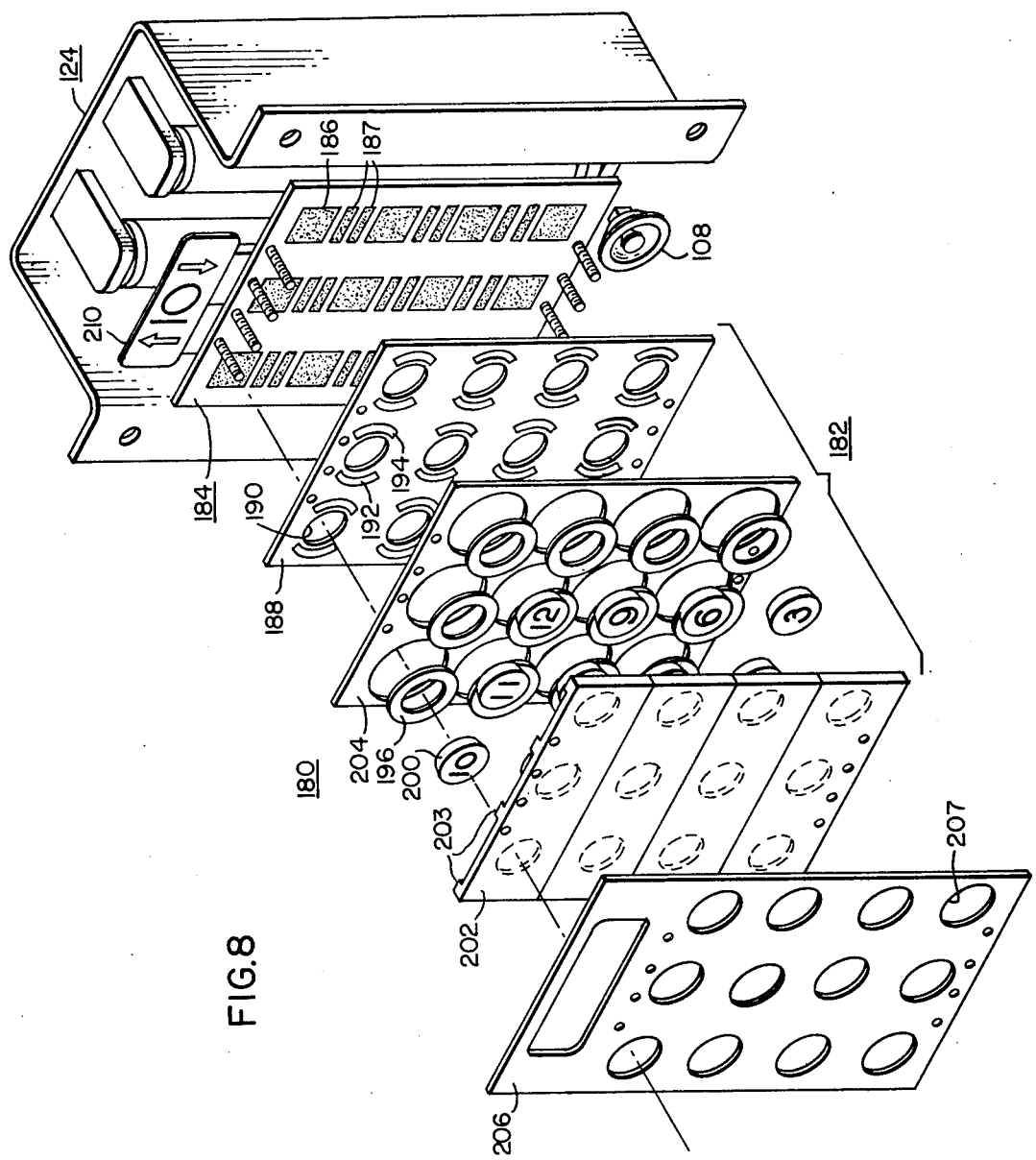
FIG. 8 is an exploded, perspective view of a plurality of signal input devices constructed according to the teachings of the invention, which may be used for the car call entry station in FIGS. 1 and 2, or for any other signal input panel or electronic keyboard.

In the embodiment of FIG. 4, the surface area of each of the liquid crystals is necessarily quite large since they must transmit light to surround the movable electrode of the switch. FIG. 8 is a perspective view of a signal input station 180 which provides the advantages enumerated for the signal input station 120, and which enables the area of each liquid crystal to be substantially reduced. This results in an appreciable reduction in the price of the liquid crystals. FIGS. 9 and 10 are plan and elevational views, respectively, of one of the switches and its associated liquid crystal shown in FIG. 8, such as the switch and liquid crystal located at the upper right-hand corner of the assembly. The plan view of FIG. 9 is a cross-sectional view, to more clearly illustrate the component parts.

More specifically, in the FIG. 8 embodiment, a plurality of switches 182 are provided in which the light from the light source 124 is visible through the central portion of the actuating button when the associated liquid crystal is in its light transmissive condition, instead of the light surrounding the actuating button. Thus, each of the plurality of liquid crystals 184, such as liquid crystal 186, may have a substantially smaller surface area than the liquid crystals of the FIG. 4 embodiment, such as about 50 to 75% less area. The stationary contacts of each of the switches are plated or etched on a printed circuit board 188, with the printed circuit board 188 having an opening therein for each of the switches, such as opening 190. The printed circuit board 188 may be constructed of a conventional opaque material used for printed circuit boards, in this embodiment. The stationary electrodes of each switch are disposed about an opening in the printed circuit board 188, such as first and second electrodes 192 and 194. The stationary electrodes are curved to conform to the curved sides of the opening 190, and they may be coated with an insulating coating 195, as hereinbefore described relative to the FIG. 4 embodiment. It would also be suitable to place the insulating coating on the movable electrode, instead of on the stationary electrodes.

The movable electrodes, such as movable electrode 196, are each washer shaped, i.e., they are essentially disc shaped, with an opening disposed through the central portion of the disc. The outer diameter of the movable electrode, and the diameter of its central opening are each selected such that the movable electrode will capacitively couple high frequency signals from one stationary electrode to the movable electrode, and then from the movable electrode to the other stationary electrode, when the movable electrode is closely coupled to the stationary electrodes. The opening in the movable electrode is preferably about the same diameter as the associated opening in the printed circuit board 188. The movable electrodes are each connected to a light transmissive actuating member, such as member 200, which members include a notation which indicates the floor number they are associated with. Member 200 may be formed of a polycarbonate material, such as Lexan. Instead of the movable electrode being a separate metallic washer member, as illustrated in FIG. 8, the movable electrode may be plated on one end of member 200.

The light transmissive, i.e., transparent or translucent, members 200 are resiliently spaced from the stationary electrodes, such as by a metallic spring member, or as illustrated in the figure, by a resilient flexible sheet member 202 which has a plurality of blind openings which extend inwardly from one major surface thereof, with the light transmissive actuating members or buttons being snapped into the blind openings. A spacer member 204 having a plurality of openings therein, such as opening 205 may be used to provide the same function as the spacer member 142 in the FIG. 4 embodiment. It would also be suitable to provide the spacing function by spaced ribs 203 on flexible sheet member 202, on the side of the sheet which faces the light source. If the ribs 203 are used, spacer 204 would not be required. The sheet member 202 is formed of a light transmissive material, i.e., either transparent or translucent, and it may be of the same construction as the sheet member 138 shown in the FIG. 4 embodiment.

A cover member 206 is provided which has a plurality of openings, such as opening 207, for permitting switch actuation, and is similar to the cover 172 of the FIG. 4 embodiment.

The electro-optic light valves may be discrete devices, as illustrated in the FIG. 4 embodiment. They may also be formed in a common insulating sheet member, as illustrated in the FIG. 8 embodiment, with the common sheet member also including certain of the integrated circuit control circuitry, indicated generally at 187 if desired. It would also be suitable to provide in effect one large liquid crystal with a plurality of individually controllable locations thereon. In any event, the liquid crystal in the FIG. 8 embodiment may be greatly reduced in area, compared with the FIG. 4 embodiment, and may have a smaller surface area than the surface area of the member 200 which is to be illuminated, due to the "projection" effect illustrated by the lines 205 and 207 in FIG. 9. The liquid crystals 186 may be constructed with, or without the transflective layer 168' shown in the FIG. 7 embodiment, as desired.

A car position and travel direction indicator 210, which may be formed of field effect liquid crystal such as disclosed in the concurrently filed Application Ser. No. 578,304, filed May 16, 1975, in the names of A. F. Mandel and L. C. Vercellotti, may be combined with the car call panel of either the FIG. 4 or FIG. 8 embodiment, utilizing the common, single source of light for its backlighting. Other signs in the car, such as "this car is next", may be displayed via a field effect liquid crystal mounted on the panel to utilize the common light source 124, with the message being in the form of a negative which becomes visible when the associated liquid crystal is switched to its light transmissive condition. The speaker 108 shown in FIG. 3 may also be incorporated into either panel, as illustrated in FIG. 8.

In summary, there has been disclosed new and improved signal input devices, combinations of such devices, and combinations of the devices in a new and improved signal input station utilized to place calls for elevator service. Only one continuously energized light source is required regardless of the number of switches, and since the light source is continuously energized its useful operating life is not adversely effected by high turn-on currents. Further, since there is only one light source, the number of wires required in the traveling cable to an elevator car, when the devices are used as the car call entry station of an elevator car is substantially reduced. In a preferred embodiment, the switches are of the movable electrode-capacitive type, and the electro-optic light valves are of the field effect liquid crystal type, which combination permits low voltage, low power signals compatible with COS/MOS logic to be used. Thus, a complete signal input station for an elevator car may utilize a simple, low cost Zener diode-resistor power supply operated from the +125 volt supply which is already in the elevator car for the operation of the safety relays.

We claim as our invention:

1. A signal input device, comprising:
   a switch including a printed circuit board having first and second major opposed sides and an opening which extends between its first and second sides, first and second electrically conductive elements disposed on the first side of said printed circuit board adjacent the opening, and a third electrically conductive element spaced from the first side of said printed circuit board and from said first and second electrically conductive elements, with said third electrically conductive element having a light transmissive portion in substantial alignment with the opening in said printed circuit board,
   a light source adapted for continuous energization,
   an electro-optic light valve operable between first and second conditions, with one of the conditions being a light transmitting condition and the other a light blocking condition, said electro-optic light valve being disposed between the light source and the second side of said printed circuit board such that light from said light source is transmitted through the opening in the printed circuit board and through the light transmissive portion of said third electrically conductive element when the electro-optic light valve is in its light transmitting condition, and
   detector means responsive to actuation of said switch for operating said electro-optic light valve from the first to the second condition.

2. The signal input device of claim 1 wherein the first condition of the electro-optic light valve is the light blocking condition and the second condition is the light transmitting condition.

3. The signal input device of claim 1 wherein the first condition of the electro-optic light valve is the light transmitting condition and the second condition is the light blocking condition.

4. The signal input device of claim 1 including means responsive to a predetermined event for operating the electro-optic light valve from the second to the first condition.

5. The signal input device of claim 1 including means other than the actuaton of the switch for operating the electro-optic light valve from the second to the first condition.

6. The signal input device of claim 1 including circuit means responsive to the detector means for initiating a predetermined control function, and reset means responsive to said predetermined control function for operating the electro-optic light valve from the second to the first condition.

7. The signal input device of claim 1 wherein the electro-optic light valve is a field effect liquid crystal.

8. The signal input device of claim 1 including means resiliently spacing the third electrically conductive element from the first and second electrically conductive elements, with the detector means detecting a change in a predetermined electrical parameter responsive to a predetermined movement of the third electrically conductive element.

9. The signal input device of claim 1 including a sheet member constructed of a light transmissive material, said sheet member being spaced from the first side of the printed circuit board, and wherein the third electrically conductive element is carried by said sheet member, said sheet member being resilient to the extent that pressure applied to the sheet member in the vicinity of the third electrically conductive element will reduce the spacing between the third electrically conductive element and the first and second electrically conductive elements, with the detector means detecting a change in a predetermined electrical parameter when the spacing between the third electrically conductive element and the first and second electrically conductive elements is changed.

10. The signal input device of claim 1 wherein the electro-optic light valve includes a transflective layer which reflects ambient light when the electro-optic light valve is in its light transmitting condition, to provide a change in the illumination level without backlighting by the light source when the electro-optic light valve changes conditions.

11. The signal input device of claim 1 wherein the first and second electrically conductive elements are curved to each extend about a predetermined portion of the opening in the printed circuit board, and the third electrically conductive element is substantially washer-shaped.

12. The signal input device of claim 11 wherein the washer-shaped third electrically conductive element is carried by a light transmissive, non-metallic member.

13. A signal input system, comprising:
a printed circuit board having first and second major opposed sides, and a plurality of openings which extend between its first and second sides,
a plurality of switches, each of said switches having first and second electrically conductive elements disposed on the first side of said printed circuit board adjacent an opening therein, and a third electrically conductive element spaced from the printed circuit board and its associated first and second electrically conductive elements, with said third electrically conductive element having a light transmissive portion in substantial alignment with the associated opening in said printed circuit board,
a light source adapted for continuous energization,
a plurality of electro-optic light valves, each of said electro-optic light valves being operable between first and second conditions, with one of the conditions being a light transmitting condition, and the other a light blocking condition, each of said electro-optic light valves being associated with one of said plurality of switches, with each electro-optic light valve being disposed between said light source and the second side of the printed circuit board, and
detector means responsive to the actuation of a switch for operating the electro-optic light valve associated with the associated switch from the first to the second condition.

14. The signal input system of claim 13 wherein the light source includes at least one electric lamp device disposed such that its light will be visible on the first side of any switch whose associated electro-optic light valve is in the light transmitting condition.

15. The signal input system of claim 13 wherein the light source includes at least one mercury vapor lamp disposed such that its light will be visible on the first side of any switch whose associated electro-optic valve is in the light transmitting condition.

16. The signal input system of claim 13 wherein the first condition of each of the electro-optic light valves is the light blocking condition and the second condition is the light transmitting condition.

17. The signal input system of claim 13 wherein the first condition of each of the electro-optic light valves is the light transmitting condition and the second condition is the light blocking condition.

18. The signal input system of claim 13 including means responsive to a predetermined event for operating an electro-optic light valve which is in its second condition back to its first condition.

19. The signal input system of claim 13 including means other than the actuation of its associated switch for operating an electro-optic light valve which is in its second condition back to its first condition.

20. The signal input system of claim 13 including circuit means responsive to the detector means for initiating a predetermined control function responsive to the switch which has been actuated, and reset means responsive to said predetermined control function for operating the electro-optic light valve associated with this switch back to the first condition.

21. The signal input system of claim 13 wherein the plurality of electro-optic light valves are field effect liquid crystals.

22. The signal input system of claim 13 including means resiliently spacing the third electrically conductive element from its associated first and second electrically conductive elements, with the detector means detecting a change in a predetermined electrical parameter responsive to a predetermined change in spacing between the third electrically conductive element and its associated first and second electrically conductive elements.

23. The signal input system of claim 22 wherein the means which resiliently spaces the third electrically conductive element of each switch from its associated first and second electrically conductive elements includes a light transmissive sheet member which carries the third electrically conductive element and is flexible to the extent that pressure applied to the sheet member adjacent the third electrically conductive element will reduce the spacing between the third electrically conductive element and its associated first and second electrically conductive elements.

24. The signal input system of claim 13 wherein each electro-optic light valve includes a transflective layer which reflects ambient light when the electro-optic light valve is in its light transmitting condition, to provide a change in illumination level without backlighting by the light source when the electro-optic light valve changes conditions.

25. An elevator system, comprising:
an elevator car mounted for movement in a building to serve the floors therein,
call means for providing a call signal which requests elevator service, and
control means responsive to the call signal provided by said call means for directing said elevator car to provide the requested service,
said call means including at least one switch including a printed circuit board having first and second major opposed sides and an opening which extends between said sides, first and second electrically conductive elements disposed on the first side of said printed circuit board adjacent the opening, and a third electrically conductive element spaced from the first side of said printed circuit board and the first and second electrically conductive elements, with said third electrically conductive element having a light transmissive portion in substantial alignment with the opening in said printed circuit board, a light source adapted for continuous energization, at least one electro-optic light valve disposed between the second side of said printed circuit board and said light source, said at least one electro-optic light valve being operable between light blocking and light transmitting conditions, and detector means responsive to actuation of said at least one switch for providing a call signal for said control means and for operating said at least one electro-optic light valve from its light blocking to its light transmitting condition to enable light from said light source to be transmitted through the opening in said printed circuit board and through the light transmissive portion of the third electrically conductive element, said control means operating said at least one electro-optic light valve back to the light blocking condition at a predetermined point in the process of answering the call for elevator service.

26. The elevator system of claim 25 wherein the at least one electro-optic light valve includes a transflective layer which reflects ambient light when the at least one electro-optic light valve is in its light transmitting condition, to provide a change in illumination level between its two conditions notwithstanding a failure of the light source.

27. The elevator system of claim 25 wherein the call means includes a plurality of switches and a plurality of electro-optic light valves each constructed and arranged similar to the at least one switch and the at least one electro-optic light valve, with the light source including at least one electric lamp disposed such that its light will be transmitted through any opening and the light transmissive portion of the associated third electrically conductive element when the associated electro-optic light valve is in the light transmitting condition.

28. A signal input device, comprising:
a switch including a printed circuit board having first and second major opposed sides and an opening which extends between its first and second sides, first and second electrically conductive elements disposed on the first side of said printed circuit board adjacent the opening, and a third electrically conductive element spaced from the first side of said printed circuit board and from said first and second electrically conductive elements, with said third electrically conductive element having a light transmissive portion in substantial alignment with the opening in said printed circuit board, a light source adapted for continuous energization, an electro-optic light valve operable between first and second conditions, with one of the conditions being a light transmitting condition and the other a light blocking condition, said electro-optic light valve being disposed between the light source and the second side of said printed circuit board such that light from said light source is transmitted through the opening in the printed circuit board and through the light transmissive portion of the third electrically conductive element when the electro-optic light valve is in its light transmitting condition, and detector means responsive to a change in the capacitance between the third electrically conductive element and the first and second electrically conductive elements when the spacing between the third electrically conductive element and the first and second electrically conductive elements is decreased during actuation of the switch, said detector means operating said electro-optic light valve from the first to the second condition in response to said change in capacitance.

* * * * *